(12) United States Patent
Chiang et al.

(10) Patent No.: US 7,906,396 B1
(45) Date of Patent: Mar. 15, 2011

(54) FLASH MEMORY AND METHOD OF FABRICATING THE SAME

(75) Inventors: Lu-Ping Chiang, Hsinchu (TW); Hsiu-Han Liao, Hsinchu (TW)

(73) Assignee: Winbond Electronics Corp., Taichung County (TW)

( * ) Notice: Subject to any disclaimer, the term of this patent is extended or adjusted under 35 U.S.C. 154(b) by 55 days.

(21) Appl. No.: 12/552,777

(22) Filed: Sep. 2, 2009

(51) Int. Cl.
*H01L 21/336* (2006.01)

(52) U.S. Cl. ........ 438/258; 438/257; 438/424; 438/593; 257/E21.209; 257/E21.545

(58) Field of Classification Search .......................... None
See application file for complete search history.

(56) References Cited

U.S. PATENT DOCUMENTS

| | | | |
|---|---|---|---|
| 6,762,095 B1 * | 7/2004 | Hsieh .............................. | 438/258 |
| 2007/0161187 A1 * | 7/2007 | Hwang et al. .................. | 438/257 |

* cited by examiner

*Primary Examiner* — Charles D Garber
*Assistant Examiner* — Yasser A Abdelaziez
(74) *Attorney, Agent, or Firm* — J.C. Patents

(57) ABSTRACT

In a method of fabricating a flash memory, a substrate with isolation structures formed therein and a dielectric layer and a floating gate formed thereon between isolation structures is provided. A mask layer is formed on the substrate, covering the isolation structures in a periphery region and the isolation structure in a cell region adjacent to the periphery region. The isolation structures in the cell region not covered by the mask layer are partially removed. Therefore, a first height difference is between surfaces of the isolation structures in the periphery region and a surface of the dielectric layer, and between a surface of the isolation structure in the cell region adjacent to the periphery region and the surface of the dielectric layer. A second height difference smaller than the first height difference is between surfaces of other isolation structures in the cell region and the surface of the dielectric layer.

14 Claims, 7 Drawing Sheets

FLASH MEMORY AND METHOD OF FABRICATING THE SAME

BACKGROUND OF THE INVENTION

1. Field of the Invention

The present invention relates to a memory and a method of fabricating the same, and more particularly to a flash memory and a method of fabricating the same.

2. Description of Related Art

A non-volatile memory allows multiple data writing, reading and erasing operations. Moreover, the stored data are retained even after the power of a device has been shut down. With these advantages, the non-volatile memory has become one of the most widely adopted memories for personal computers and electronic equipments. Generally, a typical memory device includes a stacked gate structure constituted by a floating gate and a control gate. The floating gate is disposed between the control gate and a substrate and is in a floating state. The control gates are connected to word lines. Moreover, a tunneling dielectric layer is disposed between the substrate and the floating gates, and a inter-gate dielectric layer is disposed between the floating gates and the control gates.

Conventionally, the floating gates are disposed between isolation structures, and surfaces of the floating gates are, for instance, aligned with surfaces of the isolation structures. Therefore, area of the exposed surfaces of the floating gates is increased by removing a portion of the isolation structures disposed between the floating gates. Consequently, contact areas between the floating gates and the control gates are increased so as to enhance a gate-coupling ratio (GCR).

However, the memory device includes a cell region and a periphery region. In order to remove a portion of the isolation structures between the floating gates in the cell region, a portion of the isolation structures in the periphery region is usually removed simultaneously. In the periphery region, a gate dielectric layer on the substrate disposed between the isolation structures is exposed when isolation structures are excessively removed. As a result, the gate dielectric layer is degraded in the following etching process and cleansing process, thereby affecting electrical properties of devices in the periphery region. In addition, a inter-gate dielectric layer is formed on the substrate after a portion of isolation structures is removed. After that, the inter-gate dielectric layer and the floating gates in the periphery region are removed subsequently. If a height difference between surfaces of the isolation structures in the periphery region and surfaces of the floating gates is great, the subsequent etching process for removing the inter-gate dielectric layer and the floating gates in the periphery region will be difficult to proceed due to a spacer effect.

Hence, how to remove a portion of the isolation structures in the cell region and the periphery region to enhance the GCR of the memory device and maintain excellent electrical property is a critical issue to be solved urgently.

SUMMARY OF THE INVENTION

The present invention is directed to a method of fabricating a flash memory to obtain high GCR and excellent electrical property.

The present invention is directed to a method of fabricating a flash memory. Firstly, a substrate including a cell region and a periphery region is provided. A plurality of isolation structures is formed on the substrate, and a first dielectric layer and a floating gate are formed on the substrate between the isolation structures. Next, a mask layer is formed on the substrate for covering the isolation structures in the periphery region and the isolation structure in the cell region and adjacent to the periphery region. Thereafter, a portion of the isolation structures in the cell region is removed by using the mask layer as a mask, so that a first height difference is present between surfaces of the isolation structures in the periphery region and a surface of the first dielectric layer. The first height difference is present between a surface of the isolation structure in the cell region and adjacent to the periphery region and the surface of the first dielectric layer. A second height difference is present between surfaces of the other isolation structures in the cell region and the surface of the first dielectric layer. Here, the first height difference is greater than the second height difference, and the surfaces of the isolation structures are higher than the surface of the first dielectric layer. Then, the mask layer is removed. Afterward, an inter-gate dielectric layer is formed on the substrate. The inter-gate dielectric layer and the floating gate in the periphery region are removed. After then, a conductive layer is formed on the substrate.

In one embodiment of the present invention, the first dielectric layer in the periphery region is removed and a second dielectric layer is formed on the substrate between the isolation structures in the periphery region after the inter-gate dielectric layer and the floating gate in the periphery region are removed.

In one embodiment of the present invention, the surfaces of the isolation structures in the periphery region are higher than a surface of the second dielectric layer. Moreover, a third height difference is present between the surfaces of the isolation structures in the periphery region and the surface of the second dielectric layer. Here, the third height difference is greater than the second height difference.

In light of the foregoing, in the method of fabricating the flash memory in the present invention, the mask layer is used to cover the periphery region for removing a portion of the isolation structures in the cell region. As a result, the height difference between the surfaces of the isolation structures in the cell region and a surface of a tunneling dielectric layer is greater than a height difference between the surfaces of the isolation structures in the periphery region and a surface of a gate dielectric layer. Hence, the contact area between the floating gate and a control gate is increased and the integrity of the gate dielectric layer in the periphery region is maintained for the flash memory to obtain high GCR and excellent electrical property.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

FIGS. 1A through 1I are cross-sectional flow charts of a fabrication method of a flash memory according to a first embodiment of the present invention.

Figure 1A:
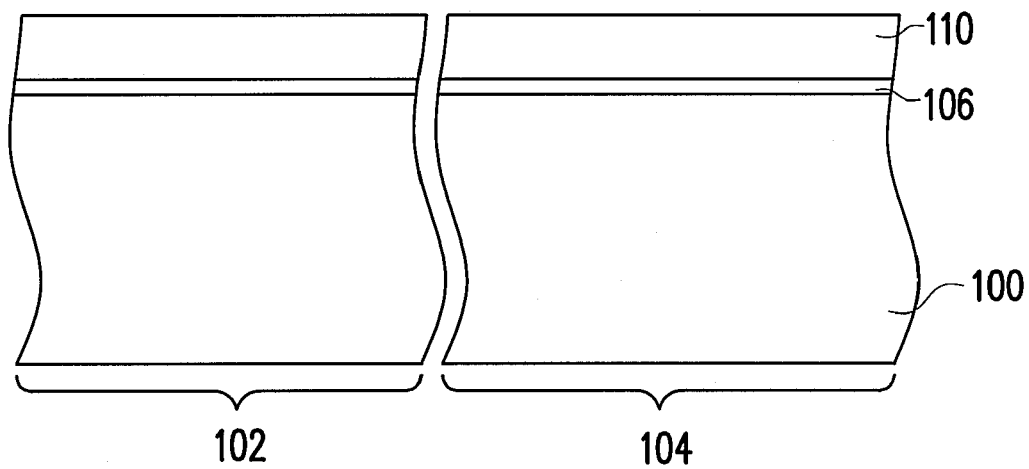
FIGS. 1A through 1I are cross-sectional flow charts of a fabrication method of a flash memory according to a first embodiment of the present invention.

Referring to FIG. 1A, a substrate 100 is provided. The substrate 100 is, for example, silicon substrate. The substrate 100 includes a cell region 102 and a periphery region 104. Thereafter, a dielectric layer 106 and a mask layer 110 are sequentially formed on the substrate 100. A material of the dielectric layer 106 is, for example, silicon oxide, and the method for fabricating the same is, for example, a thermal oxidation process or a chemical vapor deposition (CVD) process. A material of the mask layer 110 is, for example, silicon nitride, and a method of forming the same is the CVD process, for example.

Figure 1B:
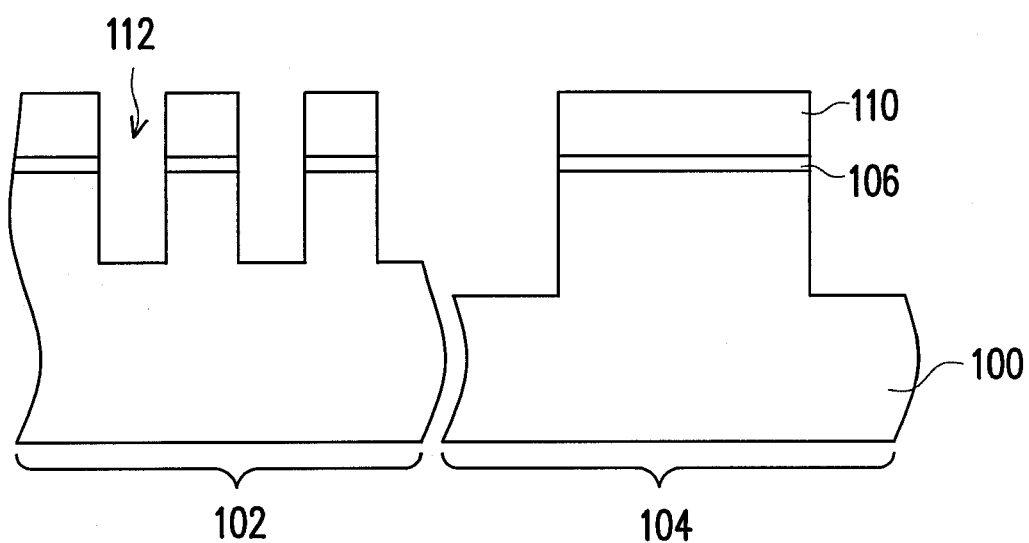

Referring to FIG. 1B, next, portions of the mask layer 110, the dielectric layer 106, and the substrate 100 are removed to form trenches 112. In a method of removing portions of the mask layer 110, the dielectric layer 106, and the substrate 100, a patterned photoresist layer (not shown) is firstly formed on the mask layer 110, for instance. Next, the patterned photoresist layer is used as a mask for an etching process to remove the exposed mask layer 110 and the dielectric layer 106 and the substrate 100 under the mask layer 110. Afterward, the patterned photoresist layer is removed.

Figure 1C:
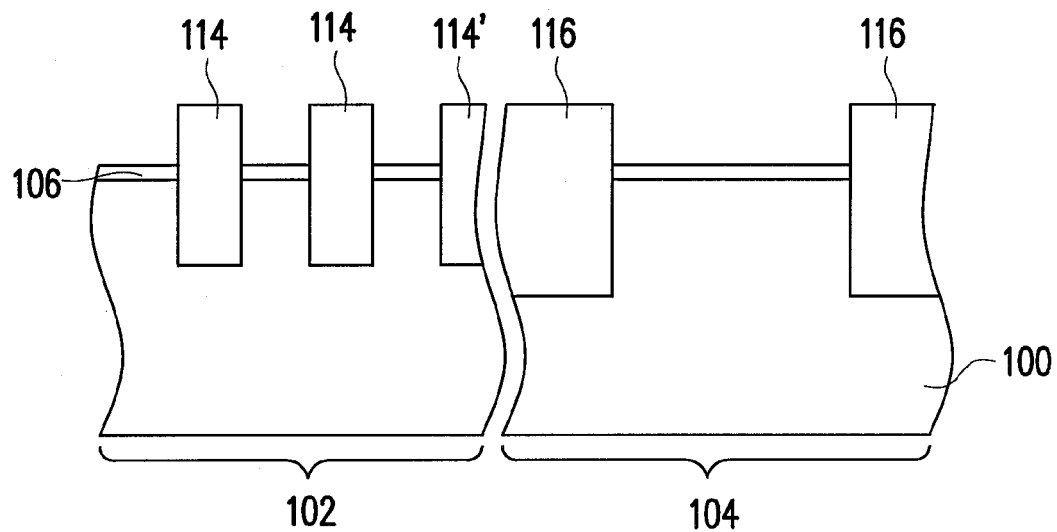

Referring to FIG. 1C, a plurality of isolation structures 114, 114', 116 is formed in the trenches 112. Here, the isolation structures 114' are isolation structures in the cell region 102 and adjacent to the periphery region 104. The isolation structures 114, 114', 116 are shallow trench isolation structures, for example. A material of the isolation structures 114, 114', 116 is high density plasma oxide, for example. In a method of forming the same, a layer of an insulating material such as silicon oxide is formed on the substrate 100 shown in FIG. 1B by using a high density plasma chemical vapor deposition (HDPCVD) process. The mask layer 110 is adopted as a polishing stop layer to perform a chemical mechanical polishing process for flattening the insulating material. Subsequently, the mask layer 110 is removed to expose the dielectric layer 106. A method of removing the mask layer 110 includes an isotropic etching process, for example.

Figure 1D:
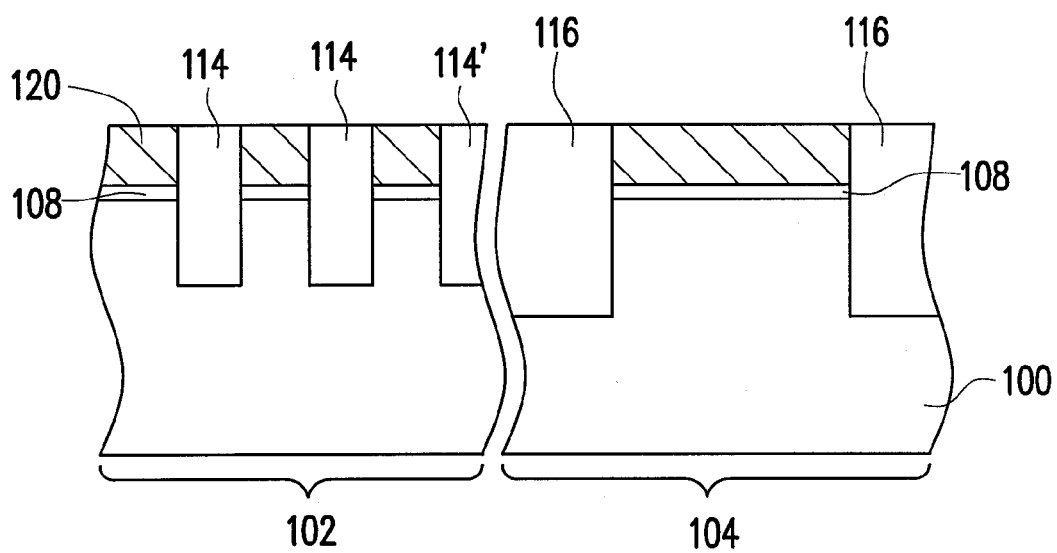

Referring to FIG. 1D, the dielectric layer 106 is removed using a wet etching method, for example, and a tunneling dielectric layer 108 is formed. Next, a conductive material layer (not shown) is formed on the substrate 100 and a material thereof is polysilicon, for instance. Later, the isolation structures 114, 114', 116 are utilized as the polishing stop layer, for example, to perform the chemical mechanical polishing process for flattening the conductive material layer so as to form floating gates 120. It should be noted that in the present embodiment, surfaces of the floating gates 120 are aligned with surfaces of the isolation structures 114, 114', 116, for example. Particularly, a method of forming the flash memory is not limited in the present invention. The flow charts illustrated in FIGS. 1A through 1C are merely one of the various front-end-of-line processes for fabricating the flash memory. In other words, one of ordinary skill in the art should well appreciate that other methods can also be used to fabricate the tunneling dielectric layer 108, the floating gates 120, and isolation structures 114, 114', 116 illustrated in FIG. 1D.

Figure 1E:
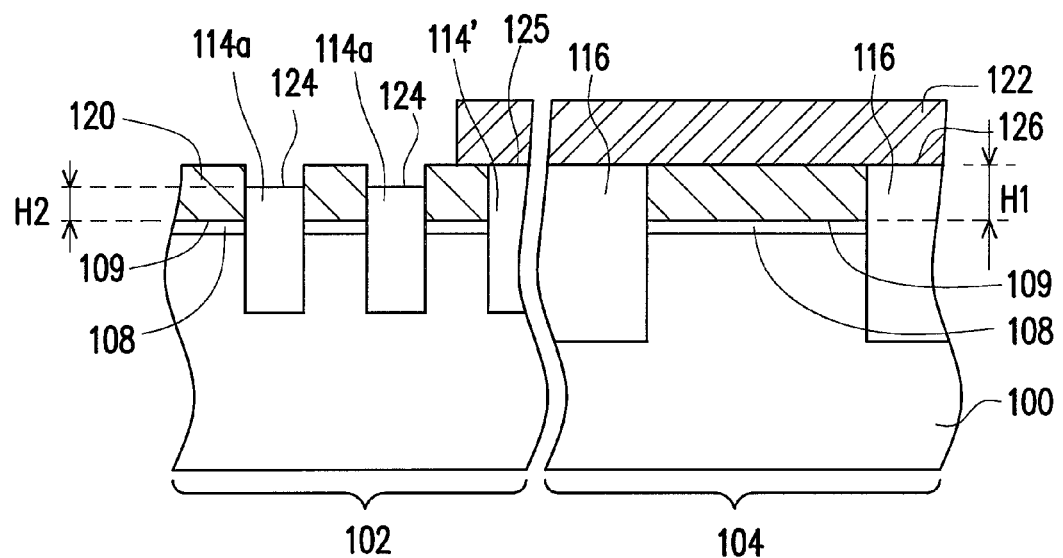

Referring to FIG. 1E, a mask layer 122 is formed on the substrate 100 for covering the isolation structures 116 in the periphery region 104 and the isolation structure 114' in the cell region 102 and adjacent to the periphery region 104. A material of the mask layer 122 is, for example, a photoresist material.

Then, a portion of the isolation structures 114 in the cell region is removed to form isolation structures 114a by using the mask layer 122 as a mask. Consequently, other than the isolation structures 114' adjacent to the periphery region 104, surfaces 124 of the other isolation structures 114a in the cell region 102 are lower than surfaces 126 of the isolation structures 116 in the periphery region 104. In other words, surfaces 124, 125, 126 of the isolation structures 114a, 114', 116 are higher than surfaces 109 of the tunneling dielectric layer 108. Moreover, a first height difference H1 is present between the surfaces 126 of the isolation structures 116 in the periphery region 104 and the surface 109 of the tunneling dielectric layer 108. The first height difference H1 is also present between the surface 125 of the isolation structure 114' in the cell region 102 and adjacent to the periphery region 104 and the surfaces 109 of the tunneling dielectric layer 108. In addition, a second height difference H2 which is smaller than the first height difference H1 is present between the surfaces 124 of the other isolation structures 114a in the cell region 102 and the surfaces 109 of the tunneling dielectric layer 108.

Figure 1F:
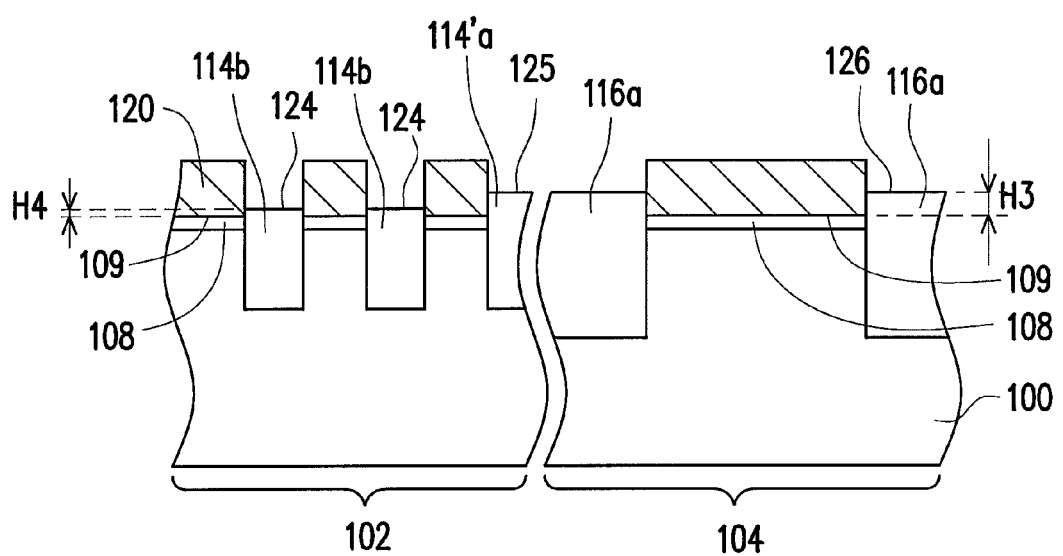

Referring to FIG. 1F, the mask layer 122 is then removed using the isotropic etching process, for example. Afterward, in the present embodiment, a blanket removal is performed to the isolation structures 114a, 114', 116 for forming isolation structures 114b, 114'a, 116a. A method of the blanket removal includes a wet etching method or a dry etching method. As a result, the surfaces 124 of the isolation structures 114b in the cell region 102 are still lower than the surfaces 126 of the isolation structures 116a in the periphery region 104 and the surface 125 of the isolation structure 114'a in the cell region 102 and adjacent to the periphery region 104. In other words, the surfaces 124, 125, 126 of the isolation structures 114b, 114'a, 116a are higher than the surfaces 109 of the tunneling dielectric layer 108. Moreover, a third height difference H3 is present between the surfaces 126 of the isolation structures 116a in the periphery region 104 and the surface 109 of the tunneling dielectric layer 108. The third height difference is also present between the surface 125 of the isolation structure 114'a in the cell region 102 and adjacent to the periphery region 104 and the surfaces 109 of the tunneling dielectric layer 108. In addition, a fourth height difference H4 which is smaller than the third height difference H3 is present between the surfaces 124 of the other isolation structures 114b in the cell region 102 and the surfaces 109 of the tunneling dielectric layer 108.

Figure 1G:
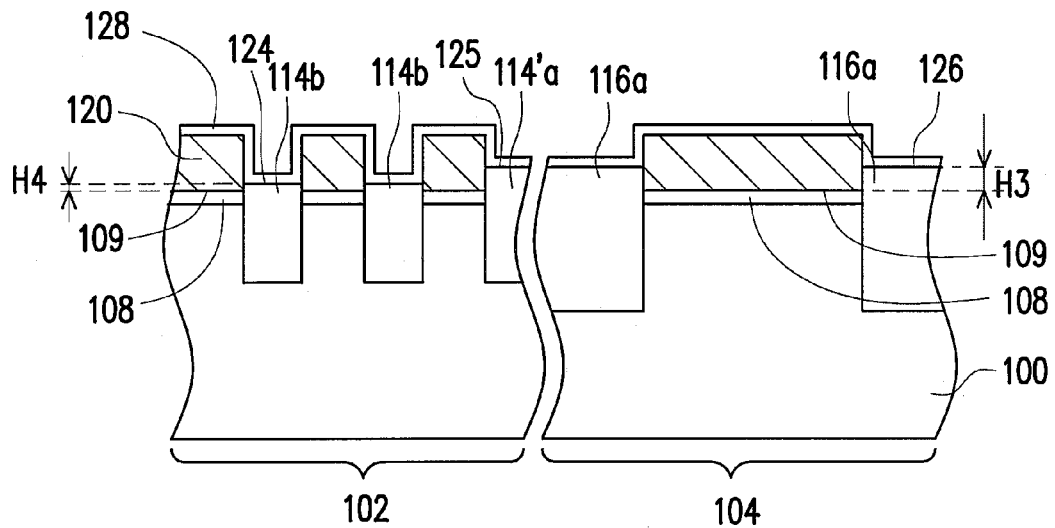

Referring to FIG. 1G, an inter-gate dielectric layer 128 is formed on the substrate 100. The inter-gate dielectric layer 128 is a composite dielectric layer stacked by a silicon oxide layer, a silicon nitride layer, and a silicon oxide layer, for example, and a method of forming thereof is the CVD process. Obviously, in other embodiments, the inter-gate dielectric layer 128 is a single layer structure of a dielectric material such as silicon oxide and silicon nitride.

Figure 1H:
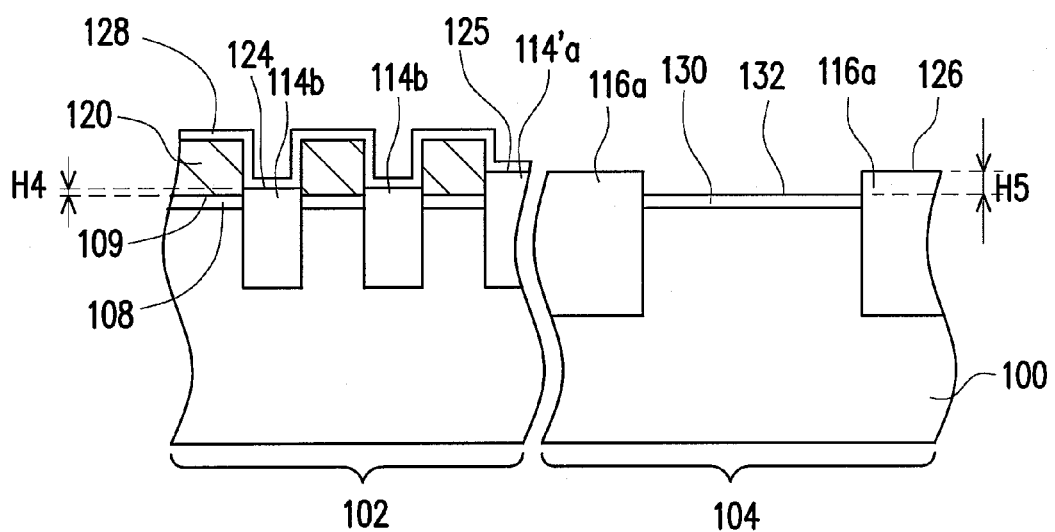

Referring to FIG. 1G and FIG. 1H simultaneously, the inter-gate dielectric layer 128, the floating gate 120, and the tunneling dielectric layer 108 in the periphery region 104 are removed. Thereafter, a gate dielectric layer 130 is formed on the substrate 100 between the isolation structures 116a in the periphery region 104. A method of removing the inter-gate dielectric layer 128, the floating gate 120, and the tunneling dielectric layer 108 in the periphery region 104 is a dry etching method or a wet etching method, for instance. A material of the gate dielectric layer 130 is, for example, silicon oxide, and a method of forming the same is, for example, the CVD process. Here, a height difference H5 between the surfaces 126 of the isolation structures 116a in the periphery region 104 and a surface 132 of the gate dielectric layer 130 is greater than the height difference H4 between the surfaces 124 of the isolation structures 114b and the surfaces 109 of the tunneling dielectric layer 108.

Figure 1I:
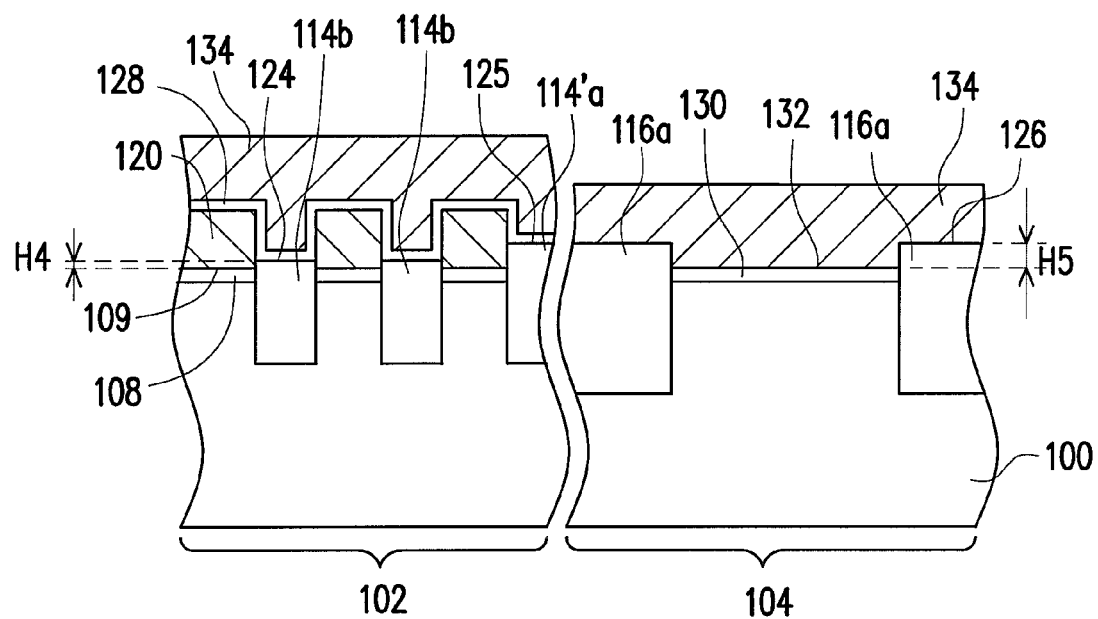

Referring to FIG. 1I, a conductive layer 134 is subsequently formed on the substrate 100 to cover the inter-gate dielectric layer 128 in the cell region 102 and the gate dielectric layer 130 and the isolation structures 116a in the periphery region 104. Herein, the conductive layer 134 in the cell region 102 is used as a control gate and the conductive layer 134 in the periphery region 104 is utilized as a gate. A material of the conductive layer 134 is, for example, doped polysilicon. In a method of forming the conductive layer 134, for instance, after an undoped polysilicon layer is formed by using the CVD process, an ion implantation step is performed to form thereof. Alternatively, the conductive layer 134 is also formed by adopting an in-situ implanting operation in the CVD process. After that, steps in the back-end-of-line process for fabricating the flash memory are performed, i.e. steps for forming a source and a drain region, a contact, a conductive line, and the like. The above steps are well known to those skilled in the art, and thus no further descriptions are provided hereinafter. In the present embodiment, the mask layer is used to cover the periphery region and the cell region adjacent to the periphery region, so that the isolation structures in the cell region and the isolation structures in the periphery region are removed in different extents. Hence, the surfaces of the isolation structures in the cell region are lower than the surfaces of the isolation structures in the periphery region. That is, the height difference between the surfaces of the isolation structures in the cell region and the surfaces of the tunneling dielectric layer is greater than the height difference between the surfaces of the isolation structures in the periphery region and the surface of the gate dielectric layer. In the cell region, since more isolation structures have been removed, a larger area of the surfaces of the floating gates is exposed, so that the contact area between the floating gates and the control gate is increased to enhance the GCR. In the periphery region, since less isolation structures have been removed, the gate dielectric layer is not exposed even after multiple etching or cleansing processes have been carried out in the periphery region. Therefore, the degradation of the gate dielectric layer is prevented and the memory device obtains excellent electrically property. Moreover, since the surface of the isolation structure in the cell region and adjacent to the periphery region is almost aligned with the surfaces of the isolation structures in the periphery region, when forming the conductive layer used as the control gate, the spacer effect of the conductive layer in the cell region and adjacent to the periphery region is prevented. In other words, the method of fabricating the flash memory in the present invention increases the contact area between the floating gates and the control gate and maintains the integrity of the gate dielectric layer in the periphery region, so that the flash memory obtains high GCR and excellent electrical property.

Second Embodiment

Figure 2A:
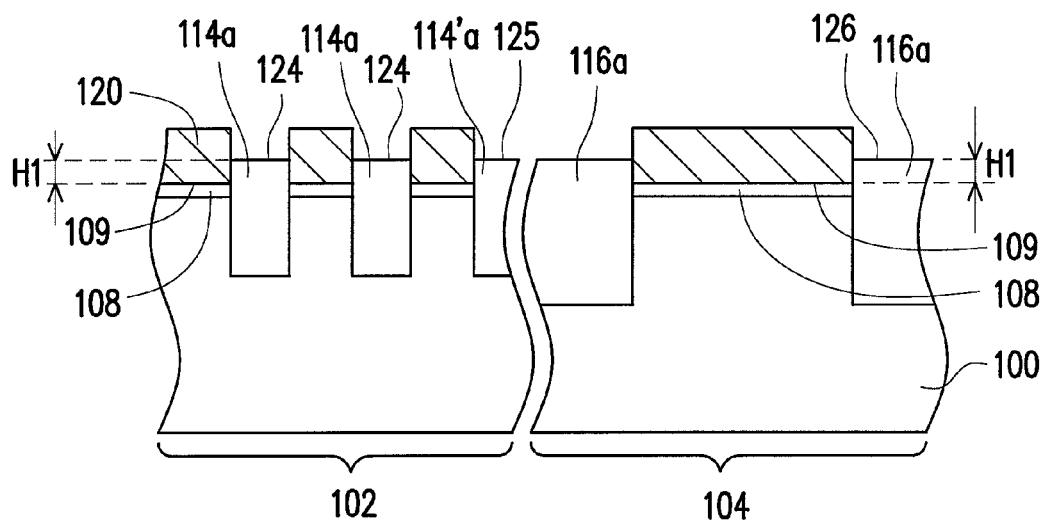
FIGS. 2A through 2C are cross-sectional flow charts of a part of a fabrication method of a flash memory according to a second embodiment of the present invention.
Figure 2B:
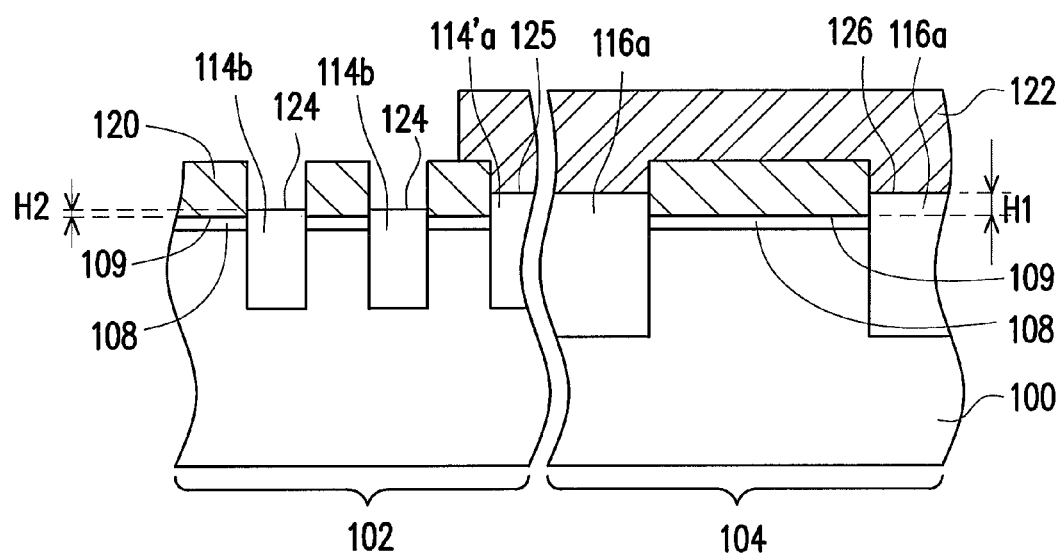
Figure 2C:
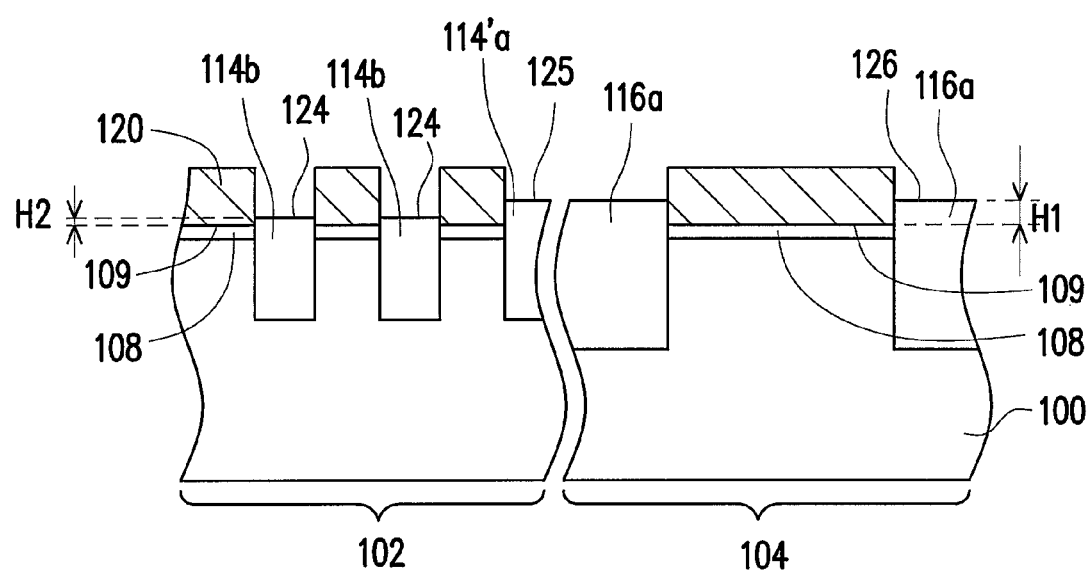

FIGS. 2A through 2C are cross-sectional flow charts of a part of a fabrication method of a flash memory according to a second embodiment of the present invention. In the present invention, the front-end-of-line process for fabricating the flash memory is similar to FIGS. 1A through 1D and the corresponding illustrations thereof in the first embodiment. Thus, only the steps following FIG. 1D are illustrated hereinafter.

Referring to FIGS. 1D and 2A simultaneously, after the tunneling dielectric layer 108 and the floating gates 120 are formed and stacked on the substrate 100 between the isolation structures 114, 114', 116, the blanket removal is performed to the isolation structures 114, 114', 116 to form isolation structures 114a, 114'a, 116a, for instance. Here, the surfaces 124, 125, 126 of the isolation structures 114a, 114'a, 116a are higher than the surfaces 109 of the tunneling dielectric layer 108. Moreover, the surfaces 124, 125, 126 of the isolation structures 114a, 114', 116 are aligned with each other, for example, and the first height difference H1 is present between the surfaces 124, 125, 126 of the isolation structures 114a, 114', 116 and the surfaces 109 of the tunneling electric layer 108. A method of the blanket removal includes a wet etching method or a dry etching method.

Referring to FIGS. 2A and 2B simultaneously, the mask layer 122 is formed on the substrate 100 for covering the isolation structures 116a in the periphery region 104 and the isolation structure 114'a in the cell region 102 and adjacent to the periphery region 104. The material of the mask layer 122 is, for example, a photoresist material.

Next, a portion of the isolation structures 114a in the cell region 102 is removed to form isolation structures 114b by using the mask layer 122 as a mask. As a result, other than the isolation structure 114'a adjacent to the periphery region 104, surfaces 124 of the other isolation structures 114b in the cell region 102 are lower than the surfaces 126 of the isolation structures 116a in the periphery region 104. In other words, the first height difference H1 is still present between the surfaces 126 of the isolation structures 116a in the periphery region 104 and the surface 109 of the tunneling dielectric layer 108. Furthermore, the first height difference H1 is still present between the surface 125 of the isolation structure 114a' in the cell region 102 and adjacent to the periphery region 104 and the surface 109 of the tunneling dielectric region 108. However, the second height difference H2 which is smaller than the first height difference H1 is present between the surfaces 124 of the other isolation structures 114b in the cell region 102 and the surfaces 109 of the tunneling dielectric layer 108.

Afterwards, referring to FIG. 2C, the mask layer 122 is removed. After the mask layer 122 is removed, the back-end-of-line process of fabricating the flash memory in the present embodiment is similar to FIGS. 1G through 1I and the corresponding illustrations thereof in the first embodiment, and thus is not repeated herein.

In summary, the mask layer is used to cover the periphery region and the cell region adjacent to the periphery region, so that the isolation structures in the cell region and the isolation structures in the periphery region are removed in different extents. Hence, the height difference between the surfaces of the isolation structures and the surfaces of the tunneling dielectric layer in the cell region is greater than the height difference between the surfaces of the isolation structures and the surface of the gate dielectric layer in the periphery region. In the cell region, since more isolation structures have been removed, the contact area between the floating gates and the control gate is increased, thereby enhancing the GCR. In the periphery region, since less isolation structures have been removed, the gate dielectric layer is prevented from degradation resulted from exposure, so that the memory device obtains excellent electrical property. In other words, the method of fabricating the flash memory in the present invention increases the contact area between the floating gates and the control gate and maintains the integrity of the gate dielectric layer in the periphery region, so that the flash memory obtains high GCR and excellent electrical property.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a flash memory, comprising:
providing a substrate comprising a cell region and a periphery region, wherein a plurality of isolation structures is formed on the substrate, and a first dielectric layer and a floating gate are sequentially formed on the substrate between the isolation structures;
forming a mask layer on the substrate, the mask layer covering the isolation structures in the periphery region and the isolation structure in the cell region and adjacent to the periphery region;
removing a portion of the isolation structures in the cell region by using the mask layer as a mask, so that a first height difference is present between surfaces of the isolation structures in the periphery region and a surface of the first dielectric layer, the first height difference is present between a surface of the isolation structure in the cell region and adjacent to the periphery region and the surface of the first dielectric layer, and a second height difference is present between surfaces of the other isolation structures in the cell region and the surface of the first dielectric layer, wherein the first height difference is greater than the second height difference and the surfaces of the isolation structures are higher than the surface of the first dielectric layer;
removing the mask layer;
forming an inter-gate dielectric layer on the substrate;
removing the inter-gate dielectric layer and the floating gates in the periphery region; and
forming a conductive layer on the substrate.

2. The method of fabricating the flash memory as claimed in claim 1, further comprising performing a blanket removal to the isolation structures after removing the mask layer.

3. The method of fabricating the flash memory as claimed in claim 2, wherein a method of the blanket removal comprises a wet etching method or a dry etching method.

4. The method of fabricating the flash memory as claimed in claim 1, further comprising performing the blanket removal to the isolation structures before forming the mask layer.

5. The method of fabricating the flash memory as claimed in claim 4, wherein a method of the blanket removal comprises the wet etching method or the dry etching method.

6. The method of fabricating the flash memory as claimed in claim 1, further comprising removing the first dielectric layer in the periphery region and forming a second dielectric layer on the substrate between the isolation structures in the periphery region after removing the inter-gate dielectric layer and the floating gates in the periphery region.

7. The method of fabricating the flash memory as claimed in claim 6, wherein the surfaces of the isolation structures in the periphery region are higher than a surface of the second dielectric layer, and a third height difference is present between the surfaces of the isolation structures in the periphery region and the surface of the second dielectric layer, wherein the third height difference is greater than the second height difference.

8. The method of fabricating the flash memory as claimed in claim 1, wherein a material of the mask layer comprises a photoresist material.

9. The method of fabricating the flash memory as claimed in claim 1, wherein a material of the isolation structures comprises silicon oxide.

10. The method of fabricating the flash memory as claimed in claim 1, wherein a material of the first dielectric layer comprises silicon oxide.

11. The method of fabricating the flash memory as claimed in claim 1, wherein a material of the second dielectric layer comprises silicon oxide.

12. The method of fabricating the flash memory as claimed in claim 1, wherein a material of the floating gates comprises doped polysilicon.

13. The method of fabricating the flash memory as claimed in claim 1, wherein a material of the inter-gate dielectric layer comprises silicon oxide/silicon nitride/silicon oxide.

14. The method of fabricating the flash memory as claimed in claim 1, wherein a material of the conductive layer comprises doped polysilicon.

* * * * *